(12) United States Patent
Sasai et al.

(10) Patent No.: US 11,372,036 B2
(45) Date of Patent: Jun. 28, 2022

(54) SENSOR DEVICE

(71) Applicant: Alps Alpine Co., Ltd., Tokyo (JP)

(72) Inventors: Kiyoshi Sasai, Miyagi-ken (JP);
Masahiro Kimura, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 181 days.

(21) Appl. No.: 16/934,954

(22) Filed: Jul. 21, 2020

(65) Prior Publication Data

US 2020/0348347 A1 Nov. 5, 2020

Related U.S. Application Data

(63) Continuation of application No. PCT/JP2018/045263, filed on Dec. 10, 2018.

(30) Foreign Application Priority Data

Jan. 25, 2018 (JP) .............................. JP2018-010531

(51) Int. Cl.
*G01R 27/26* (2006.01)
*H03K 5/26* (2006.01)
*H03M 1/12* (2006.01)
*H03K 5/00* (2006.01)

(52) U.S. Cl.
CPC ........... *G01R 27/2605* (2013.01); *H03K 5/26* (2013.01); *H03M 1/12* (2013.01); *H03K 2005/00019* (2013.01)

(58) Field of Classification Search
USPC ........................................ 324/660–663, 679
See application file for complete search history.

(56) References Cited

U.S. PATENT DOCUMENTS 10,126,875 B2 * 11/2018 Haga ................... G06F 3/04166
2015/0042357 A1 2/2015 Haga et al.

FOREIGN PATENT DOCUMENTS

WO 2013/030966 3/2013

OTHER PUBLICATIONS

International Search Report from International Application No. PCT/JP2018/045263 dated Feb. 12, 2019.

* cited by examiner

*Primary Examiner* — Vincent Q Nguyen
(74) *Attorney, Agent, or Firm* — Beyer Law Group LLP

(57) ABSTRACT

A sensor device includes a sensor unit that generates a detection signal having the same detection frequency as an entered sinusoidal analog signal and matching a physical quantity to be detected; a reference signal generating unit that generates a reference signal having the detection frequency, according to the entered analog signal; converting units that convert the detection signal and reference signal to digital signals in synchronization with a clock signal; a demodulating unit that multiplies the digital detection signal by each of two sinusoidal synchronization signals having the detection frequency, the phases of the two synchronization signals being shifted from each other by one-fourth of a cycle, and generates two demodulated signals free from a harmonic component; and a correcting unit that corrects the demodulated signals according to the digital reference signal so as to suppress variations, in the demodulated signals, caused by variations in the clock signal phase.

8 Claims, 9 Drawing Sheets

SENSOR DEVICE

CLAIM OF PRIORITY

This application is a Continuation of International Application No. PCT/JP2018/045263 filed on Dec. 10, 2018, which claims benefit of Japanese Patent Application No. 2018-010531 filed on Jan. 25, 2018. The entire contents of each application noted above are hereby incorporated by reference.

BACKGROUND OF THE INVENTION

1. Field of the Invention

The present disclosure relates to a sensor device that detects a physical quantity such as capacitance.

2. Description of the Related Art

A capacitive sensor that detects a change in capacitance is widely used in input interfaces for information devices such as smart phones, switches used to manipulate devices, sensors, such as barometric pressure sensors and vibration sensors, that detect a minute change, and various other fields. A general capacitive sensor has: electrodes (conductors) used to form a capacitor that causes a change in capacitance; and a capacitance detection circuit, such as a charge amplifier, that gives a driving voltage across the electrodes to charge and discharge the capacitor and detects a change (current) in charges, the change being caused by the charging and discharging. When a sinusoidal alternating voltage is given across the electrodes as the driving voltage, a signal output from the capacitance detection circuit as a detection result also has a sinusoidal component having the same frequency as the driving voltage. The amplitude of this sinusoidal component changes in proportion to the capacitance of the capacitor. Therefore, a change in capacitance can be detected according to the sinusoidal component having the same frequency as the driving signal included in the output signal from the capacitance detection circuit.

With this type of capacitive sensor, if external noise having the same frequency as the driving voltage enters the output signal from the capacitance detection circuit, a distinction cannot be made between the external noise and the sinusoidal component matching the capacitance without taking any countermeasures. In view of this, the capacitive sensor described in International Publication No. WO2013/030966 removes external noise by using a response (signal component to be detected and external noise) from a sensor system in a period in which a sinusoidal signal given to the sensor system was output and a response (only external noise) from the sensor system in a period in which the output of the sinusoidal signal was stopped.

SUMMARY OF THE INVENTION

When a capacitance detection circuit is driven with a sinusoidal wave, a detection value for capacitance is obtained by performing demodulation in which an output signal from the capacitance detection circuit is multiplied by a sinusoidal wave having substantially the same phase (frequency) as a sinusoidal wave used for driving. When the output signal from the capacitance detection circuit is multiplied by the sinusoidal wave, the multiplication result includes a direct-current component proportional to the amplitude of an alternating-current component having the same frequency as the sinusoidal wave as well as a harmonic component having a frequency that is an integer multiple of the frequency of the sinusoidal wave. When a low-pass filer is applied to the multiplication result to remove the harmonic component, the direct-current component is extracted. This direct-current component has a value proportional to the capacitance.

In the demodulation processing described above, when there is a match between the relative phase of the sinusoidal wave used to drive the capacitive sensor (the sinusoidal component will be referred to below as the driving sinusoidal component) and the relative phase of the demodulation sinusoidal component used for multiplication in demodulation processing (the sinusoidal component will be referred to below as the demodulation sinusoidal component), the detection value (direct-current component described above) obtained as a result of demodulation processing is maximized. Therefore, the relative phases of the driving sinusoidal wave and demodulation sinusoidal component are adjusted so that the detection value is maximized that is, detection sensitivity is maximized.

However, the relative phases of the driving sinusoidal wave and demodulation sinusoidal component may vary as time elapses. This type of phase variation is caused when, for example, the phase of a clock signal in a digital circuit used to generate a sinusoidal wave varies (this variation may also be referred to as jitter). When the relative phases of the driving sinusoidal wave and demodulation sinusoidal component vary, the detection value varies.

When demodulation processing described above is performed in a digital circuit (discrete time system), the demodulation sinusoidal component is generated in synchronization with a clock signal. Even if the phase of the clock signal varies, therefore, the relative phase of the demodulation sinusoidal component with respect to the clock signal is kept substantially constant. However, the capacitance detection circuit is an analog circuit (continuous time system), and the driving sinusoidal wave is entered into the capacitance detection circuit as an analog signal. If the phase of the clock signal varies, therefore, the relative phase of the analog signal with respect to the clock signal varies depending on the frequency response of the phase in the analog circuit. The capacitive sensor includes a low-pass filter that removes the high-frequency component of an output signal from the capacitive sensor, a low-pass filter used to generate a driving sine wave, and the like, besides the capacitance detection circuit. Therefore, the frequency responses of the phases in these circuits affect the phase of the analog signal.

The capacitive sensor described in International Publication No. WO2013/030966 above can remove external noise but cannot suppress variations in the detection value that are caused by variations in the phase of a clock signal in a digital circuit.

The present disclosure provides a sensor device that can suppress variations in a detection value that are caused by variations in the phase of a clock signal in a digital circuit.

A sensor device according to a first aspect of the present disclosure has: a sensor unit that generates a detection signal according to an entered sinusoidal analog signal, the detection signal having an amplitude matching a physical quantity to be detected and also having the same detection frequency as the analog signal; a reference signal generating unit that generates a reference signal having the detection frequency, according to the entered analog signal; a first analog-digital converting unit that converts the detection signal to a digital signal in synchronization with a clock signal; a second analog-digital converting unit that converts the reference signal to a digital signal in synchronization with the clock signal; a demodulating unit that multiplies each of two sinusoidal synchronization signals having the detection frequency and the detection signal converted to a digital signal together, the phases of the two sinusoidal synchronization signals being shifted from each other by one-fourth of a cycle, and generates two demodulated signals in which a harmonic component has been removed from the results of the multiplication; and a correcting unit that corrects the demodulated signals according to the reference signal converted to a digital signal so that variations in the demodulated signals are suppressed, the variations being caused by variations in the phase of the clock signal. A correlation exists between the phase of the detection signal with respect to the analog signal and the phase of the reference signal with respect to the analog signal. The correcting unit calculates a change in the relative phase of the detection signal with respect to the synchronization signals according to a change in the relative phase of the reference signal with respect to the synchronization signals, and corrects at least one of the two demodulated signals so that the relative phase of the detection signal, the relative phase being represented by the two demodulated signals, approaches a phase in which the calculated change in the relative phase is canceled.

The present disclosure can provide a sensor device that can suppress variations in a detection value that are caused by variations in the phase of a clock signal in a digital circuit.

DESCRIPTION OF THE PREFERRED EMBODIMENTS

Outline

Figure 1:
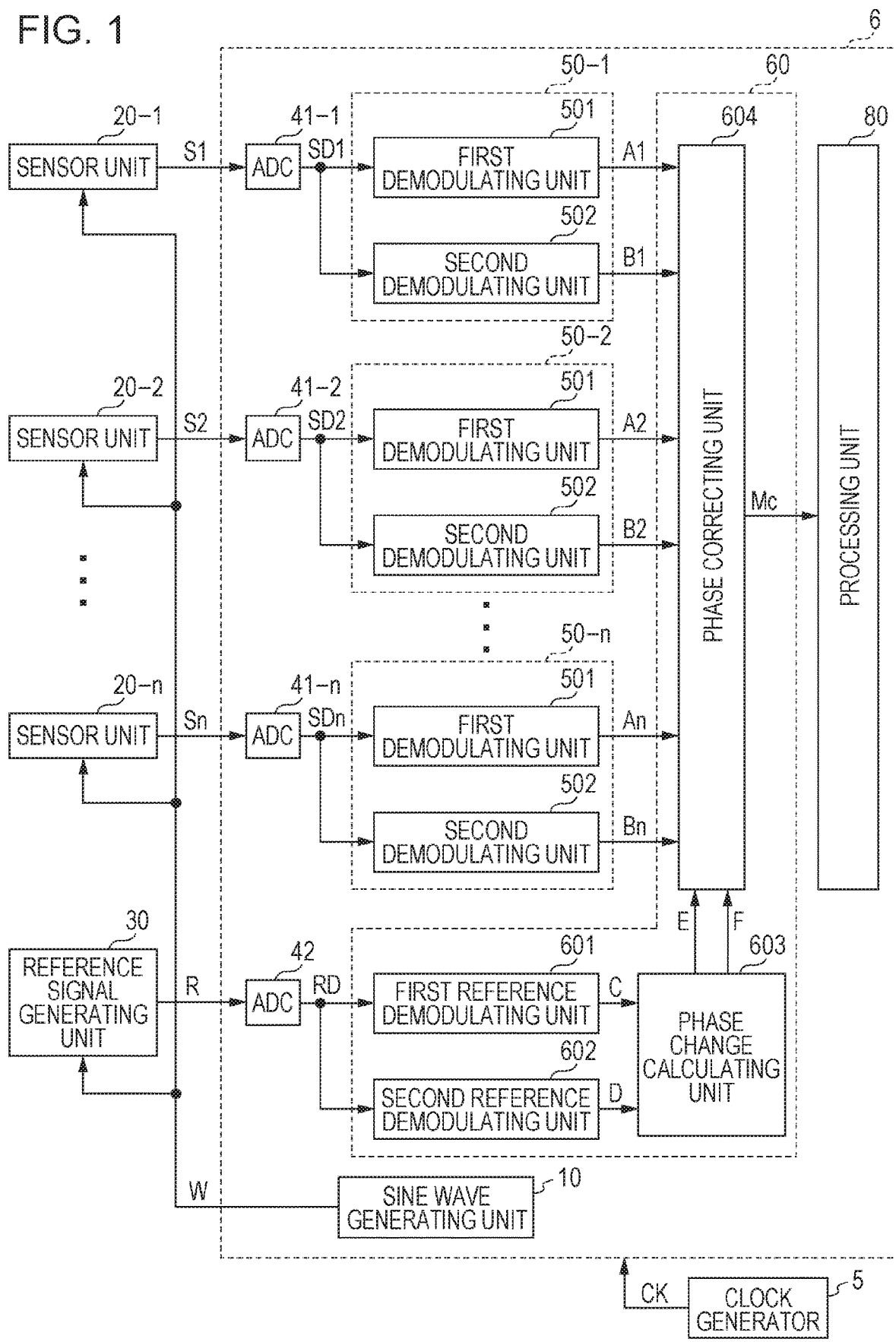
FIG. 1 illustrates an example of the structure of a sensor device according to a first embodiment.

First, a sensor device according to the present disclosure will be outlined.

A sensor device according to a first aspect of the present disclosure has: a sensor unit that generates a detection signal according to an entered sinusoidal analog signal, the detection signal having an amplitude matching a physical quantity to be detected and also having the same detection frequency as the analog signal; a reference signal generating unit that generates a reference signal having the detection frequency, according to the entered analog signal; a first analog-digital converting unit that converts the detection signal to a digital signal in synchronization with a clock signal; a second analog-digital converting unit that converts the reference signal to a digital signal in synchronization with the clock signal; a demodulating unit that multiplies each of two sinusoidal synchronization signals having the detection frequency and the detection signal converted to a digital signal together, the phases of the two sinusoidal synchronization signals being shifted from each other by one-fourth of a cycle, and generates two demodulated signals in which a harmonic component has been removed from the results of the multiplication; and a correcting unit that corrects the demodulated signals according to the reference signal converted to a digital signal so that variations in the demodulated signals are suppressed, the variations being caused by variations in the phase of the clock signal.

A correlation exists between the phase of the detection signal with respect to the analog signal and the phase of the reference signal with respect to the analog signal. The correcting unit calculates a change in the relative phase of the detection signal with respect to the synchronization signals according to a change in the relative phase of the reference signal with respect to the synchronization signals. The correcting unit also corrects at least one of the two demodulated signals so that the relative phase of the detection signal, the relative phase being represented by the two demodulated signals, approaches a phase in which the calculated change in the relative phase is canceled.

With the sensor device according to the first aspect above, in the sensor unit, a detection signal is generated according to an entered sinusoidal analog signal, the detection signal having an amplitude matching a physical quantity to be detected and also having the same detection frequency as the analog signal. In the reference signal generating unit, a reference signal having the detection frequency is generated according to the entered analog signal. A correlation exists between the phase of the detection signal with respect to the analog signal and the phase of the reference signal with respect to the analog signal. The detection signal and reference signal are each converted to a digital signal synchronized with a clock signal.

The detection signal, which is a digital signal synchronized with a clock signal, is multiplied by each of two sinusoidal synchronization signals having the detection frequency and having phases shifted from each other by one-fourth of a cycle, after which two demodulated signals are generated in which a harmonic component has been removed from the results of the multiplication. Since the two sinusoidal synchronization signals are orthogonal to each other, the two demodulated signals represent the relative phase of the detection signal with respect to the synchronization signals.

When the phase of the clock signal varies, the phase of the detection signal generated in the sensor unit relatively varies with respect to the clock signal. The phase of the detection signal converted to a digital signal also relatively varies with respect to the clock signal. However, the two synchronization signals synchronized with the clock signal do not relatively vary with respect to the clock signal. Therefore, when the phase of the clock signal varies, the relative phase between the detection signal and each of the two synchronization signals varies and the two demodulated signals also vary, each demodulated signal being a signal in which a harmonic component has been removed from the result of the multiplication of the detection signal and one of the two demodulated signals.

In the above sensor device, therefore, the demodulated signal is corrected according to the reference signal converted to a digital signal synchronized with the clock signal. Specifically, since a correlation exists between the phase of the detection signal with respect to the analog signal and the phase of the reference signal with respect to the analog signal, a change in the relative phase of the detection signal with respect to the synchronization signals is calculated according to a change in the relative phase of the reference signal with respect to the synchronization signals. At least one of the two demodulated signals is corrected so that the relative phase, represented by the two demodulated signals, of the detection signal with respect to the synchronization signals approaches a phase in which the calculated change in the phase is canceled. Thus, even if the relative phase between each synchronization signal and the detection signal varies along with a variation in the phase of the clock signal, at least one of the two demodulated signal is corrected so that variations of the phase are canceled, suppressing demodulated signal variations caused by variations of the phase of the clock signal.

Preferably, the two synchronization signals may include a first synchronization signal and a second synchronization signal, and the two demodulated signals may include a first demodulated signal and a second demodulated signal.

The demodulating unit may include: a first demodulating unit that multiplies the first synchronization signal and the detection signal together, and generates the first demodulated signal in which a harmonic component has been removed from the result of the multiplication; and a second demodulating unit that multiplies the second synchronization signal and the detection signal together, and generates the second demodulated signal in which a harmonic component has been removed from the result of the multiplication.

The correcting unit may include: a first reference demodulating unit that multiplies the first synchronization signal and reference signal together, and generates a first reference demodulated signal in which a harmonic component has been removed from the result of the multiplication; a second reference demodulating unit that multiplies the second synchronization signal and reference signal together, and generates a second reference demodulated signal in which a harmonic component has been removed from the result of the multiplication; a phase change calculating unit that calculates a change in the phase of a detection complex number in which the first demodulated signal is a real part and the second demodulated signal is an imaginary part, according to a change in the phase of a reference complex number in which the first reference demodulated signal is a real part and the second reference demodulated signal is an imaginary part; and a phase correcting unit that calculates, as a corrected demodulated signal, a signal that matches at least one of the real part and imaginary part of a complex number obtained by correcting the phase of the detection complex number so that the change in the phase is canceled, the change having been calculated in the phase change calculating unit.

With this structure, the phase of the detection complex number, in which the first demodulated signal is a real part and the second demodulated signal is an imaginary part, represents the relative phase of the detection signal with respect to the synchronization signals, and the phase of the reference complex number, in which the first reference demodulated signal is a real part and the second reference demodulated signal is an imaginary part, represents the relative phase of the reference signal with respect to the synchronization signals. Since a correlation exists between the phase of the detection signal with respect to the analog signal and the phase of the reference signal with respect to the analog signal, a change in the phase of the detection complex number is calculated according to a change in the phase of the reference complex number. A signal that matches at least one of the real part and imaginary part of a complex number is calculated as a corrected demodulated signal, the complex number being obtained by correcting the phase of the detection complex number so that the calculated change is canceled.

Preferably, the phase change calculating unit may calculate a correction complex number having a phase matching a change in the phase of the reference complex number with respect to the phase of an initial value of the reference complex number. The phase correcting unit may calculate, as the corrected demodulated signal, a signal matching at least one of the real part and imaginary part of the product of the detection complex number and correction complex number.

With this structure, the correction complex number has a phase matching a change in the phase of the reference complex number with respect to the phase of the initial value of the reference complex number. A signal matching at least one of the real part and imaginary part of the product of the correction complex number and detection complex number is calculated as the corrected demodulated signal.

Preferably, the phase change calculating unit may calculate a first complex number that has the same phase as the initial value and the absolute value of which is 1, and each time a new reference complex number is generated, may calculate a second complex number that has the same phase as the generated reference complex number and the absolute value of which is 1. Each time a new second complex number is calculated, the phase change calculating unit may calculate, as the correction complex number, a complex number obtained by dividing the first complex number by the second complex number.

With this structure, the first complex number has the same phase as the initial value and an absolute value of 1, and is calculated according to the initial value. The second complex number has the same phase as the reference complex number and an absolute value of 1. Each time a new reference complex number is calculated, the second complex number is calculated. The correction complex number is obtained by dividing the first complex number by the second complex number. Each time a new second complex number is calculated, the correction complex number is calculated.

A sensor device according to a second aspect of the present disclosure has: a sine wave generating unit that generates a sinusoidal analog signal synchronized with a clock signal; a sensor unit that generates a detection signal that has an amplitude matching a physical quantity to be detected and also has the same detection frequency as the analog signal, according to the analog signal generated in the sine wave generating unit; a reference signal generating unit that generates a reference signal having the detection frequency, according to the analog signal; an analog-digital converting unit that converts the detection signal to a digital signal in synchronization with a correction clock signal, the phase of which has been corrected with respect to the clock signal; a demodulating unit that multiplies a sinusoidal synchronization signal and the detection signal together, the synchronization signal being synchronized with the correction clock signal and having the detection frequency, the detection signal having been converted to a digital signal, and generates a demodulated signal in which a harmonic component has been removed from the result of the multiplication; and a correcting unit that corrects the phase of the correction clock signal with respect to the clock signal so that variations in the demodulated signal are suppressed, the variations being caused by variations in the phase of the clock signal. A correlation exists between the phase of the detection signal with respect to the analog signal and the phase of the reference signal with respect to the analog signal. The correcting unit detects a change in the relative phase of the reference signal with respect to the correction clock signal, and corrects the phase of the correction clock signal with respect to the clock signal according to the result of the detection so that the relative phase of the reference signal is kept constant.

With the sensor device according to the second aspect above, in the sine wave generating unit, a sinusoidal analog signal synchronized with a clock signal is generated. In the sensor unit, according to the analog signal generated in the sine wave generating unit, a detection signal is generated that has an amplitude matching a physical quantity to be detected and also has the same detection frequency as the analog signal. In the reference signal generating unit, a reference signal having the detection frequency is generated according to the analog signal. A correlation exists between the phase of the detection signal with respect to the analog signal and the phase of the reference signal with respect to the analog signal. The detection signal is converted to a digital signal synchronized with a correction clock signal, the phase of which has been corrected with respect to the clock signal. The detection signal, which is a digital signal synchronized with the correction clock signal, is multiplied by the sinusoidal synchronization signal synchronized with the correction clock signal, the synchronization signal having the detection frequency, after which a demodulated signal in which a harmonic component has been removed is generated from the result of the multiplication.

When the phase of the clock signal varies, the phase of the analog signal synchronized with the clock signal varies. Therefore, the phase of the detection signal generated in the sensor unit and the phase of the reference signal generated in the reference signal generating unit also vary. A variation in the phases of the detection signal and reference signal is caused by a variation in the phase of the analog signal synchronized with the clock signal. Since the sensor unit and reference signal generating unit each include an analog circuit that has a frequency response of the phase, a deviation occurs between a variation in the phases of the detection signal and reference signal output through the relevant analog circuit and a variation in the phase of the clock signal. That is, when the phase of the clock signal varies, the phases of the detection signal and reference signal relatively vary with respect to the clock signal.

Now, it will be assumed that the phase of the correction clock signal with respect to the clock signal is fixed. Even when the phase of the clock signal varies, the phase of the sinusoidal synchronization signal synchronized with the correction clock signal does not relatively vary with respect to the clock signal. When phase of the clock signal varies, however, the phase of the detection signal converted to a digital signal relatively varies with respect to the clock signal. Therefore, when the phase of the clock signal varies, the relative phase between the detection signal and synchronization signal varies and the demodulated signal, in which a harmonic component has been removed from the result of a multiplication of the detection signal and synchronization signal, varies.

With the sensor device described above, therefore, the phase of the correction clock signal with respect to the clock signal is corrected. Specifically, a change in the relative phase of the reference signal with respect to the correction clock signal is detected, and the phase of the correction clock signal with respect to the clock signal is corrected according to the result of the detection so that the relative phase of the reference signal with respect to the correction clock signal is kept constant. A correlation exists between the phase of the detection signal with respect to the analog signal and the phase of the reference signal with respect to the analog signal. Therefore, when the relative phase of the reference signal with respect to the correction clock signal is kept constant, the relative phase of the detection signal with respect to the correction clock signal is also kept substantially constant.

Thus, even when the phase of the clock signal varies, the relative phase between the detection signal and the synchronization signal synchronized with the correction clock signal is kept substantially constant. Since a variation in the relative phase between the synchronization signal and the detection signal is suppressed, a variation in the demodulated signal obtained from the result of a multiplication of the detection signal and synchronization signal is also suppressed.

Preferably, the correcting unit may include: a delay control unit that controls the delay of the correction clock signal with respect to the clock signal according to an entered control signal; a phase comparing unit that makes a comparison between the phase of the reference signal and the phase of the correction clock signal or the phase of a signal obtained by dividing the correction clock signal; and a feedback unit that feeds the control signal back to the delay control unit according to the comparison result in the phase comparing unit.

Preferably, the sensor unit may include: an electrode forming a detection capacitor, the capacitance of which varies as an object approaches the detection capacitor; and a capacitance detection circuit that applies a sinusoidal voltage matching the analog signal to the electrode to generate the detection signal so as to include a component matching a sinusoidal current flowing in the detection capacitor according to the sinusoidal voltage.

Preferably, the reference signal generating unit may have a structure in which a built-in capacitor having a predetermined capacitance is provided instead of the detection capacitor, the structure being similar to the structure of the sensor device. In the capacitance detection circuit, the reference signal may be generated instead of the detection signal.

With the structure described above, regardless of whether there is proximity of an object, when a predetermined capacitance is detected, a reference signal that is substantially the same as the detection signal at that time is stably generated in the reference signal generating unit. This enables the correcting unit to easily perform stable correction operation based on the reference signal.

First Embodiment

A sensor device according to a first embodiment of the present invention will be described below with respect to the drawings.

FIG. 1 illustrates an example of the structure of the sensor device according to the first embodiment. The sensor device in FIG. 1 has a clock generator 5, a sine wave generating unit 10, n sensor units 20-1 to 20-n, a reference signal generating unit 30, n first analog-digital converting units 41-1 to 41-*n*, a second analog-digital converting unit 42, n demodulating units 50-1 to 50-*n*, a correcting unit 60, and a processing unit 80.

To simplify the description below, "analog-digital converting (or conversion)" may be referred to as "AD converting (or conversion)". Each of the sensor units 20-1 to 20-*n* may be referred to as the sensor unit 20 without being distinguished. Each of the first AD converting units 41-1 to 41-*n* may be referred to as the first AD converting unit 41 without being distinguished. Each of the demodulating units 50-1 to 50-*n* may be referred to as the demodulating unit 50 without being distinguished.

The clock generator 5 generates a clock signal CK to be supplied to a digital circuit 6 in the sensor device. The digital circuit 6 includes part of the sine wave generating unit 10, the first AD converting units 41-1 to 41-*n*, the second AD converting unit 42, the demodulating units 50-1 to 50-*n*, the correcting unit 60, and the processing unit 80, as illustrated in FIG. 1.

Figure 2:
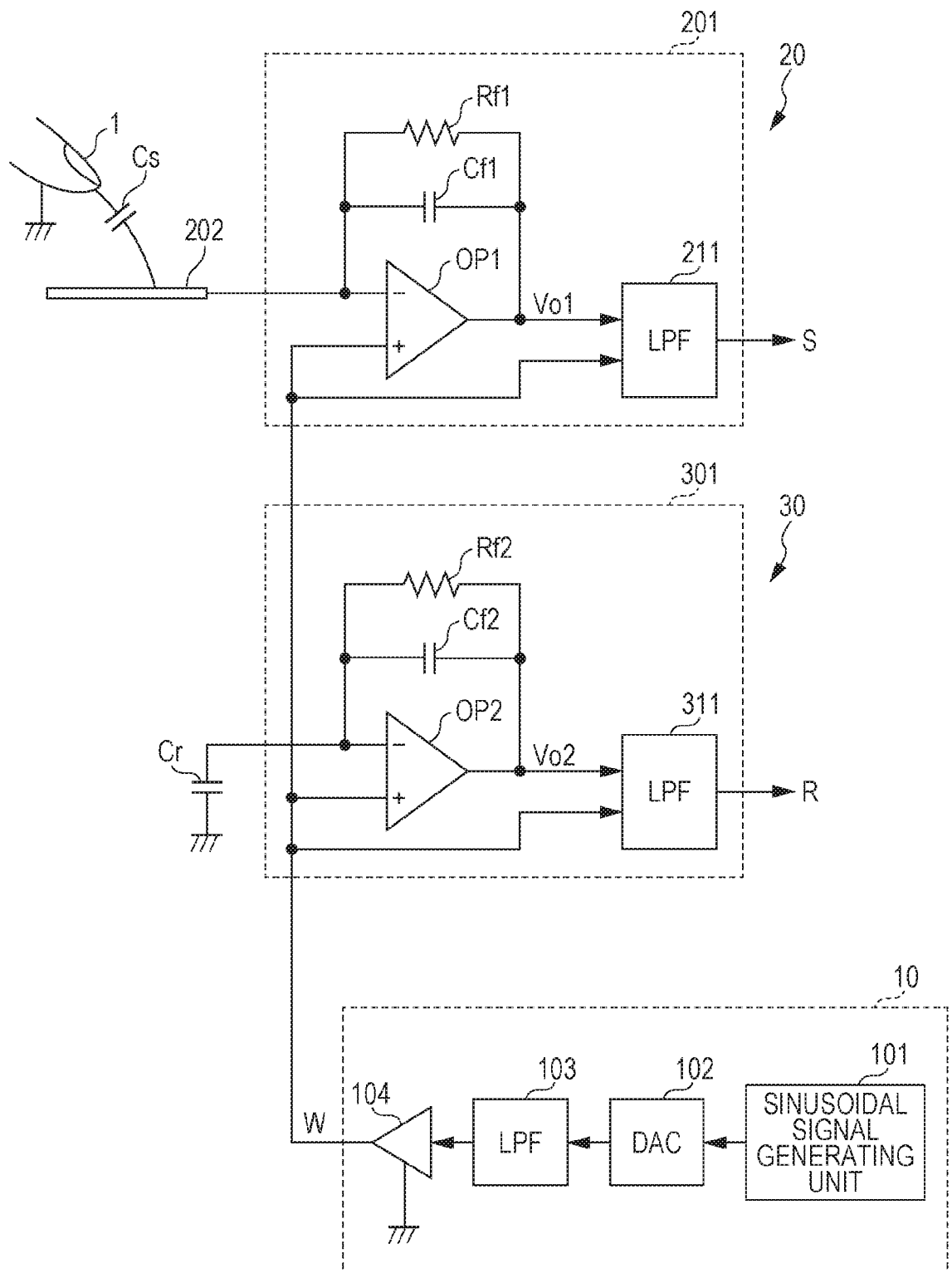
FIG. 2 illustrates an example of the structures of a sensor unit, a reference signal generating unit, and a sine wave generating unit.

The sine wave generating unit 10 is a circuit that generates a sinusoidal analog signal W synchronized with a clock signal CK. The sine wave generating unit 10 includes, for example, a sinusoidal signal generating unit 101, a digital-analog converter (DA converter) 102, a low-pass filter 103, and an amplifier 104, as illustrated in FIG. 2. The sine wave generating unit 101 generates a sinusoidal digital signal (numerical data of a sine wave) at intervals of a predetermined period synchronized with a clock signal CK, and enters the digital signal into the DA converter 102. The DA converter 102 outputs an analog signal matching the sinusoidal signal value received at intervals of the predetermined period. The low-pass filter 103 removes an unnecessary high-frequency component included in the analog signal output from the DA converter 102, and outputs a sine wave with a predetermined frequency. The amplifier 104, which is a buffer amplifier, enters the sine wave output from the low-pass filter 103 to the sensor units 20 and reference signal generating unit 30 as an analog signal W.

According to an entered sinusoidal analog signal W, the sensor unit 20-*i* (i is an integer from 1 to n) generates a detection signal Si (sometimes referred to below as the detection signal S without being distinguished) that has an amplitude matching a physical quantity to be detected and also has the same frequency as the analog signal W (the frequency will be referred to as the detection frequency). In this embodiment, the sensor unit 20 may detect any physical quantity. As an example, however, it will be assumed here that the sensor unit 20 detects capacitance. An example of the structure of the sensor unit 20 that detects capacitance is illustrated in the upper portion in FIG. 2.

The sensor unit 20 in FIG. 2 preferably includes a capacitance detection circuit 201 and an electrode 202. The electrode 202 preferably forms a detection capacitor Cs, the capacitance of which varies as an object 1 such as a finger approaches the detection capacitor Cs. In the example in FIG. 2, the detection capacitor Cs is formed between the electrode 202 and the object 1, which can be regarded as ground from the viewpoint of alternating current.

The sensor unit 20 preferably drives the capacitance detection circuit 201 so that a sinusoidal voltage matching the analog signal W is applied to the electrode 202. The capacitance detection circuit 201 preferably generates a detection signal S including a component matching a sinusoidal current flowing in the detection capacitor Cs according to the sinusoidal voltage. In the example in FIG. 2, the capacitance detection circuit 201 includes an operational amplifier OP1, a capacitor Cf1, a resistor Rf1, and a low-pass filter 211. The inverting input terminal of the operational amplifier OP1 is connected to the electrode 202. The capacitor Cf1 and resistor Rf1 are connected in parallel between the inverting input terminal and output terminal of the operational amplifier OP1. The analog signal W is entered into the non-inverting input terminal of the operational amplifier OP1. A voltage having substantially the same sine wave as the analog signal W is generated in the detection capacitor Cs. A current substantially the same as the current flowing in the detection capacitor Cs flows in the parallel circuit composed of the capacitor Cf1 and resistor Rf1. An output voltage Vo1 from the operational amplifier OP1 becomes substantially equal to the sum of the voltage of the analog signal W and a voltage generated in the parallel circuit composed of the capacitor Cf1 and resistor Rf1 due to the current flowing in the detection capacitor Cs.

The low-pass filter 211 has a differential amplifier on the input side. The low-pass filter 211 uses the differential amplifier to amplify the difference between the analog signal W and the output voltage Vo1 from the operational amplifier OP1, and attenuates the high-frequency component to prevent aliasing in AD conversion performed in a circuit behind the low-pass filter 211. The detection signal S output from the low-pass filter 211 is a substantially sinusoidal signal that has an amplitude matching the capacitance of the detection capacitor Cs and also has the same detection frequency as the analog signal W.

The reference signal generating unit 30 generates a reference signal R according to the entered analog signal W, the reference signal R having the same detection frequency as the analog signal W. A correlation exists between the phase of the detection signal S with respect to the analog signal W and the phase of the reference signal R with respect to the analog signal W. For example, there is an approximate match between a change in the phase of the detection signal S with respect to the change in the phase of the analog signal W and a change in the phase of the reference signal R with respect to the change in the phase of the analog signal W.

The reference signal generating unit 30 preferably includes, for example, a capacitance detection circuit 301 and a built-in capacitor Cr as illustrated in the middle portion in FIG. 2. The capacitance detection circuit 301 preferably has substantially the same circuit structure as the capacitance detection circuit 201 in the sensor unit 20. An operational amplifier OP2, a capacitor Cf2, a resistor Rf2, and a low-pass filter 311 included in the capacitance detection circuit 301 respectively correspond to the operational amplifier OP1, capacitor Cf1, resistor Rf1, and low-pass filter 211 included in the capacitance detection circuit 201. The built-in capacitor Cr, which has a predetermined capacitance, is preferably provided instead of the detection capacitor Cs formed between the electrode 202 and the object 1. The built-in capacitor Cr is connected between the inverting input terminal of the operational amplifier OP2 and ground. The capacitance detection circuit 301 detects a constant capacitance of the built-in capacitor Cr, and preferably generates the reference signal R so as to have a substantially constant amplitude matching the detected capacitance.

When a variation (jitter) occurs in the clock signal CK generated in the clock generator 5, a timing to generate a sine wave synchronized with the clock signal CK in the sine wave generating unit 101 in the sine wave generating unit 10 illustrated in FIG. 2 varies. Therefore, the phase of the analog signal W also varies accordingly. When the phase of the analog signal W varies, the phase of the detection signal S generated in the sensor unit 20 and the phase of the reference signal R generated in the reference signal generating unit 30 also vary accordingly. When the sensor unit 20 and reference signal generating unit 30 have substantially the same structure as illustrated in FIG. 2, there is an approximate match between a variation in the phase of the detection signal S and a variation in the phase of the reference signal R, these variations being caused by a variation in the phase of the clock signal CK.

The first AD converting unit 41-$i$ converts a detection signal Si received from the sensor unit 20-$i$ to a digital signal in synchronization with the clock signal CK, and outputs the digital signal as a detection signal SDi (sometimes referred to below as the detection signal SD without being distinguished). The second AD converting unit 42 converts the reference signal R generated in the reference signal generating unit 30 to a digital signal in synchronization with the clock signal CK, and outputs the digital signal as a reference signal RD. The first AD converting unit 41 and second AD converting unit 42 each include, for example, an AD converting circuit, such as a delta-sigma AD converting circuit, in the same method.

The demodulating unit 50-$i$ multiplies each of two sinusoidal synchronization signals (first synchronization signal U1 and second synchronization signal U2) and the detection signal SDi together, the two sinusoidal synchronization signals having the same detection frequency as the analog signal W and having phases shifted from each other by one-fourth of a cycle, the detection signal SDi having been converted to a digital signal. The demodulating unit 50-$i$ then generates two demodulated signals, which are a first demodulated signal Ai and a second demodulated signal Bi, in each of which a harmonic component (component having a frequency that is an integer multiple of the detection frequency) has been removed from the results of the multiplication. In the description below, the first demodulated signal Ai may be referred to as the first demodulated signal A without being distinguished, and the second demodulated signal Bi may be referred to as the second demodulated signal B without being distinguished.

The demodulating unit 50 preferably includes, for example, a first demodulating unit 501 and a second demodulating unit 502 as illustrated in FIG. 1. The first demodulating unit 501 preferably multiplies the first synchronization signal U1 with a sine wave and the detection signal SD together, the first synchronization signal U1 being generated in a first synchronization signal generating unit 71 (see FIG. 3), and generates a first demodulated signal A in which a harmonic component has been removed from the result of this multiplication. In the example in FIG. 3, the first demodulating unit 501 includes a multiplying unit 511 that multiplies the detection signal SD and first synchronization signal U1 together, and also includes a low-pass filter 512 that removes a harmonic component from the multiplication result in the multiplying unit 511.

The second demodulating unit 502 preferably multiplies the second synchronization signal U2 with a sine wave and the detection signal SD together, the second synchronization signal U2 being generated in a second synchronization signal generating unit 72 (see FIG. 3), and generates a second demodulated signal B in which a harmonic component has been removed from the result of this multiplication. In the example in FIG. 3, the second demodulating unit 502 includes a multiplying unit 521 that multiplies the detection signal SD and second synchronization signal U2 together, and also includes a low-pass filter 522 that removes a harmonic component from the multiplication result in the multiplying unit 521.

Figure 3:
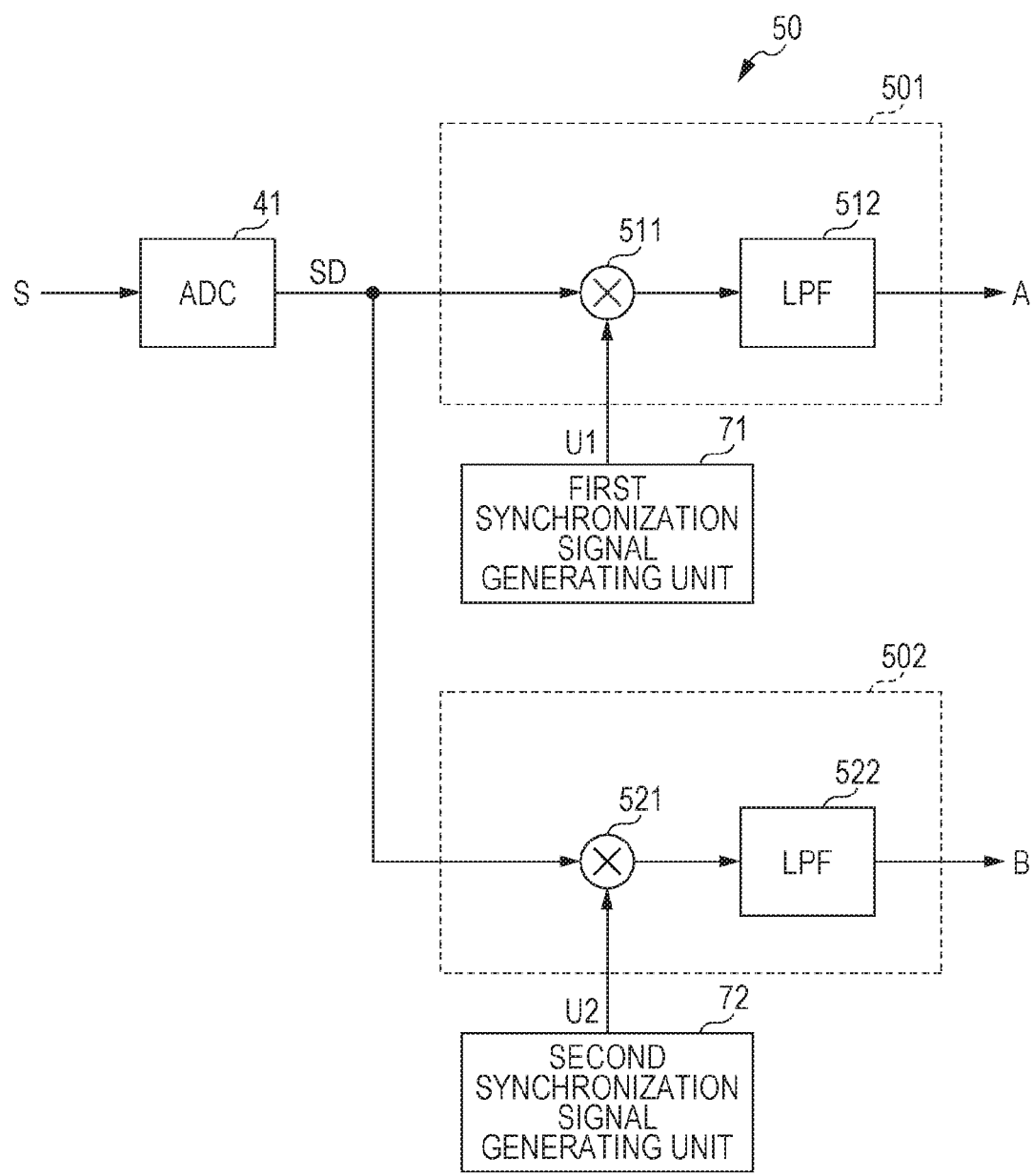
FIG. 3 illustrates an example of the structure of a demodulating unit.

The digital circuit 6 includes the first synchronization signal generating unit 71, illustrated in FIG. 3, that generates the first synchronization signal U1 and the second synchronization signal generating unit 72, illustrated in FIG. 3, that generates the second synchronization signal U2. The first synchronization signal U1 and second synchronization signal U2 are each a sinusoidal digital signal (numerical data of a sine wave). The first synchronization signal generating unit 71 and second synchronization signal generating unit 72 respectively generate the first synchronization signal U1 and second synchronization signal U2, the phases of which are shifted from each other by one-fourth of a cycle, at intervals of a predetermined period synchronized with the clock signal CK.

As an example, it will be assumed here that when small error in phase and small variations are ignored, the phase of the first synchronization signal U1 and the phase of the reference signal R are substantially the same. It will also be assumed that the first synchronization signal U1 is a sine wave and the second synchronization signal U2 is a cosine wave the phase of which advances by one-fourth of a cycle with respect to the first synchronization signal U1. However, the relationship of the phase of the first synchronization signal U1 to the reference signal R, the relationship of phase of the second synchronization signal U2 to the reference signal R, and the relationship between the first synchronization signal U1 and the second synchronization signal U2 are not limited to this example.

The two sinusoidal synchronization signals U1 and U2 are orthogonal to each other with their phases shifted by one-fourth of a cycle, that is, they are a sine wave and a cosine wave. Therefore, the two demodulated signals A and B, which are generated by multiplying the detection signal SD and each of the two synchronization signals U1 and U2 together and removing a harmonic component, represent the relative phase of the detection signal SD with respect to the synchronization signals U1 and U2. Now, a complex number will be taken as an example in which the first demodulated signal A generated by multiplying the detection signal SD by the first synchronization signal U1, which is a sine wave, and removing a harmonic component, is a real part and the second demodulated signal B generated by multiplying the detection signal SD by the second synchronization signal U2, which is a cosine wave, and removing a harmonic component, is an imaginary part (the complex number will be referred to below as the detection complex number Qs). Then, the phase of the complex number Qs represents the relative phase of the detection signal SD with respect to the synchronization signals U1 and U2.

Figure 4:
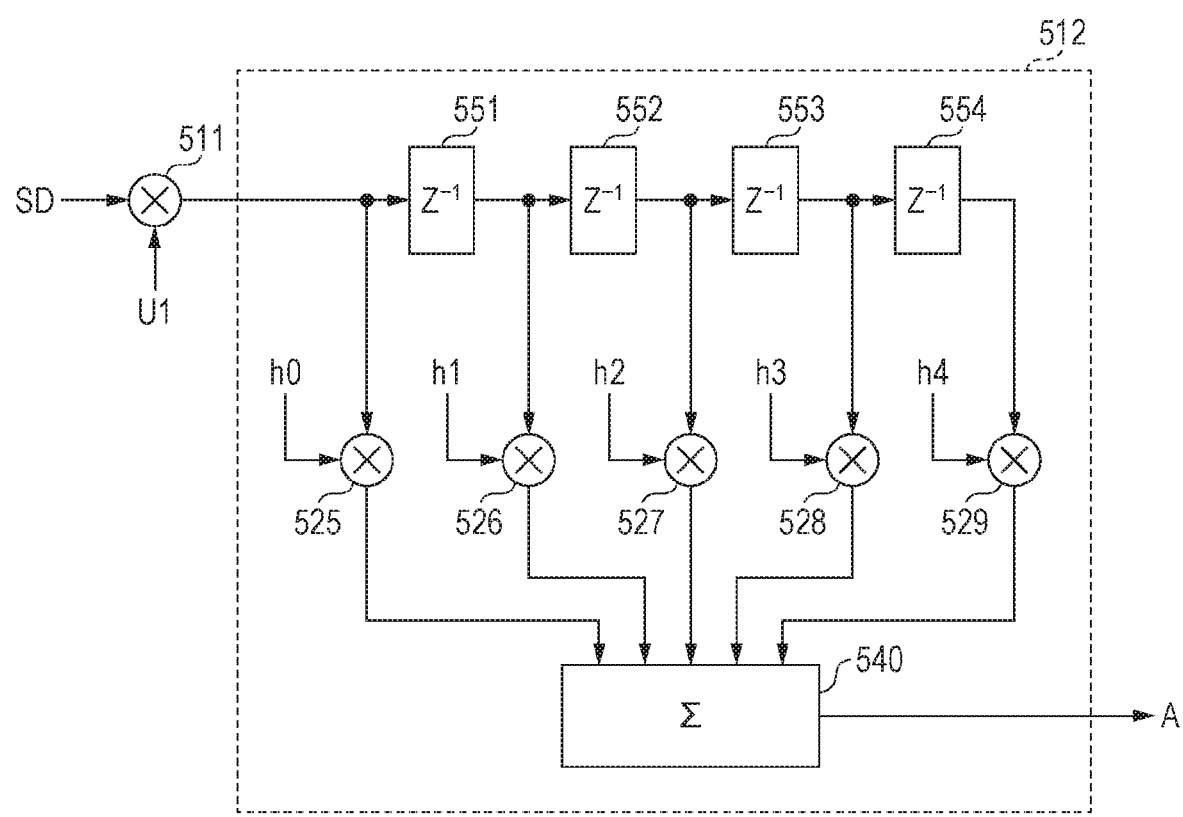
FIG. 4 illustrates an example of the structures of a multiplying unit and low-pass filter.

FIG. 4 illustrates an example of the structures of the multiplying unit 511 and low-pass filter 512. In the example in FIG. 4, the low-pass filter 512 is a finite impulse response (FIR) filter including five taps. The low-pass filter 512 includes four cascaded delay circuits (registers) 551 to 554, five multiplying units 525 to 529, and an adding unit 540. The product (SD×U1) of the detection signal SD output from the multiplying unit 511 and the first synchronization signal U1 is entered into the first (delay circuit 551) of the four delay circuits 551 to 554. This product is shifted to the later circuits in succession at timings synchronized with the clock signal CK. The product to be entered into the first circuit (delay circuit 551) is multiplied by a coefficient h0 in the multiplying unit 525. The four products held in the four delay circuits are multiplied by coefficients h1 to h4 in the multiplying units 526 to 529, respectively. The five coefficients h0 to h4 have a value corresponding to an impulse response of a predetermined transfer function, such as, for example, a Sinc function, that stipulates a low pass filter property. The adding unit 540 adds the products in the five multiplying units 525 to 529, and outputs the addition result as the first demodulated signal A.

Figure 5:
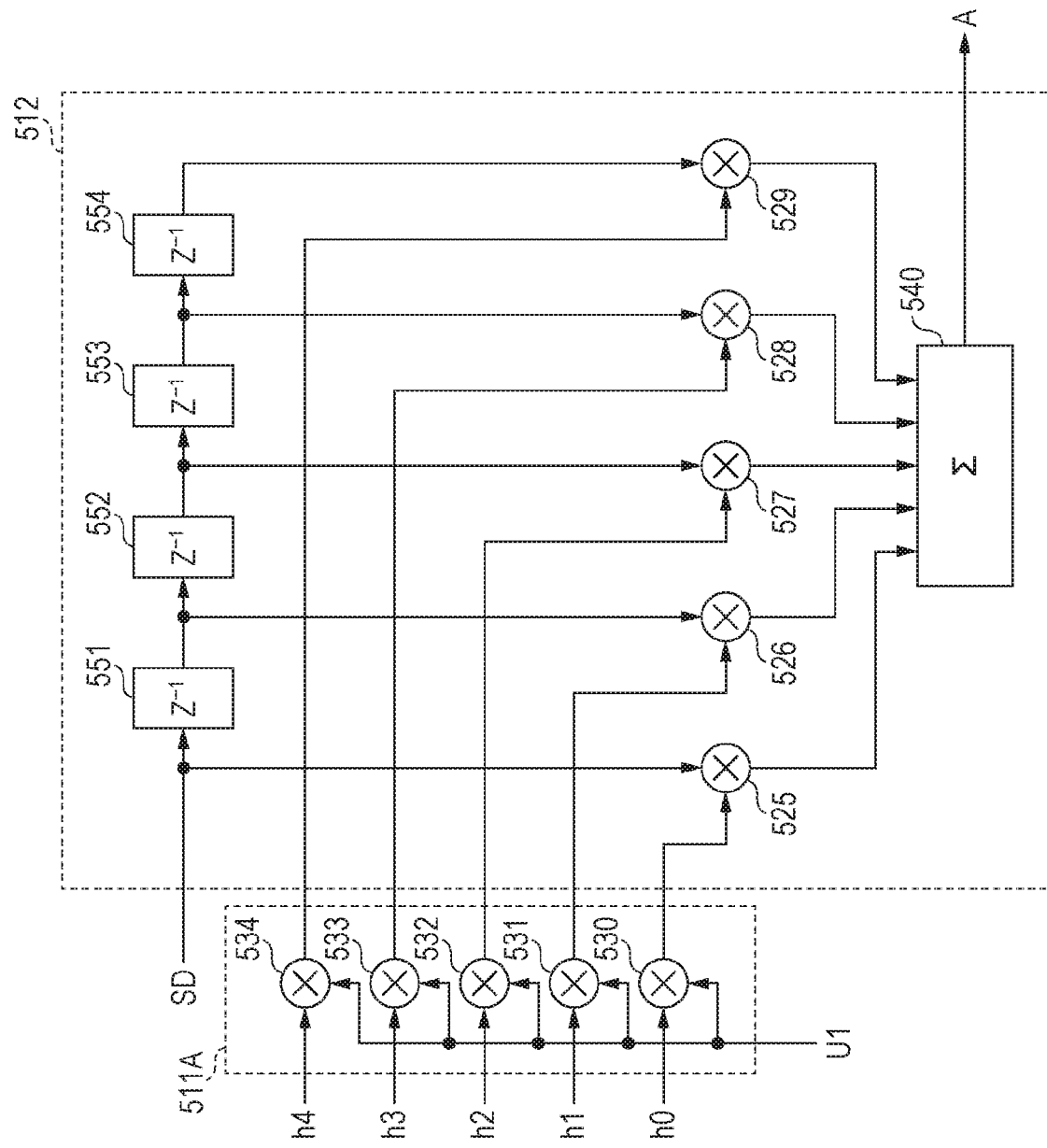
FIG. 5 illustrates another example of the structures of the multiplying unit and low-pass filter.

The multiplication of the detection signal SD and the first synchronization signal U1 may be performed in a circuit in front of the low-pass filter 512 as illustrated in FIG. 4. Alternatively, for example, the multiplication may be performed together with the multiplication performed of the coefficients h0 to h4 in the low-pass filter 512, as illustrated in FIG. 5. In the example in FIG. 5, the detection signal SD is entered into the first circuit (delay circuit 551) of the delay circuits 551 to 554 in the low-pass filter 512 without alteration. Instead, the five coefficients h0 to h4 are respectively multiplied by the first synchronization signal U1 in five multiplying units 530 to 534 in a multiplying unit 511A. Then, instead of the coefficients h0 to h4, the product of the coefficient h0 and first synchronization signal U1 to the product of the coefficient h4 and first synchronization signal U1 are respectively entered into the multiplying units 525 to 529 in the low-pass filter 512, after which the detection signal SD is multiplied by these products.

The correcting unit 60 corrects the demodulated signals A and B according to the reference signal RD, which has been converted to a digital signal, so that variations in the demodulated signals A and B that are caused by variations in the phase of the clock signal CK.

First, the correcting unit 60 calculates a change in the relative phase of the detection signal SD with respect to the synchronization signals U1 and U2 according to a change in the relative phase of the reference signal RD with respect to the synchronization signals U1 and U2. For example, the correcting unit 60 generates two reference demodulated signals C and D by multiplying the reference signal RD and each of the two synchronization signals U1 and U2 together and removing a harmonic component, and regards a phase change represented by the two reference demodulated signals C and D as a change in the relative phase of the detection signal SD. Specifically, the correcting unit 60 calculates a change in the phase of a complex number in which a first reference demodulated signal C generated by multiplying the reference signal RD by the first synchronization signal U1, which is a sine wave, and removing a harmonic component, is a real part and a second reference demodulated signal D generated by multiplying the reference signal RD by the second synchronization signal U2, which is a cosine wave, and removing a harmonic component, is an imaginary part (the complex number will be referred to below as the reference complex number Qr).

The correcting unit 60 corrects at least one of the two demodulated signals A and B so that the relative phase of the detection signal SD represented by the two demodulated signals A and B, that is, the phase of the detection complex number Qs, approaches a phase in which a change, as calculated above, in the phase is canceled. For example, of the two demodulated signals A and B, the correcting unit 60 corrects only the first demodulated signal A, the phase of which approximates the phases of the detection signal SD and reference signal RD. Thus, even if the relative phase between the synchronization signal U1 and the detection signal SD and the relative phase between the synchronization signal U2 and the detection signal SD vary along with a variation in the phase of the clock signal CK, at least one of the demodulated signals A and B is corrected so that variations of the phases are canceled, suppressing variations of the demodulated signals A and B, the variations being caused by variations of the phase of the clock signal CK.

The correcting unit 60 preferably includes, for example, a first reference demodulating unit 601, a second reference demodulating unit 602, a phase change calculating unit 603, and a phase correcting unit 604, as illustrated in FIG. 1.

Figure 6:
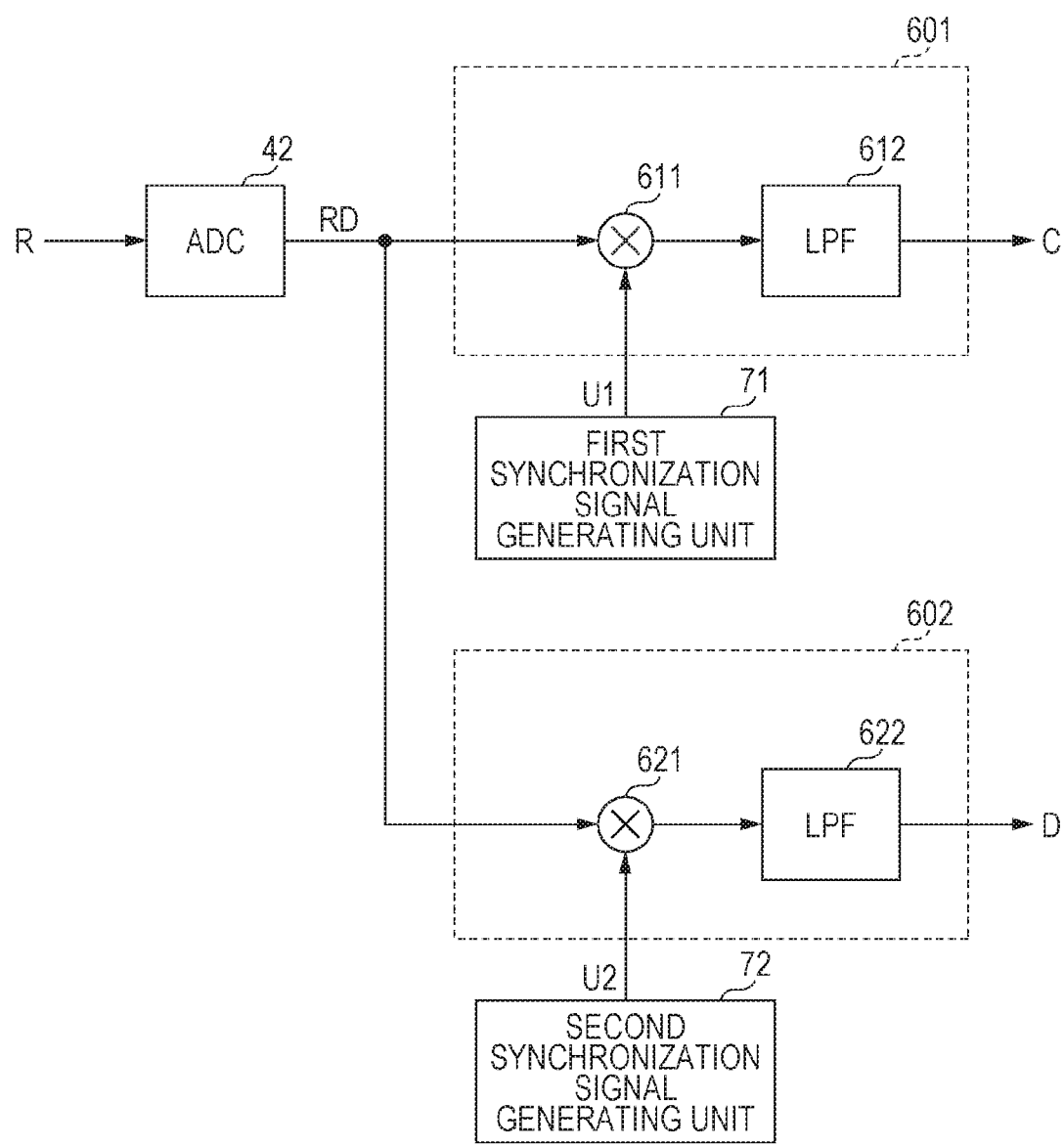
FIG. 6 illustrates an example of the structures of a first reference demodulating unit and second reference demodulating unit.

The first reference demodulating unit 601 preferably multiplies the first synchronization signal U1 and reference signal RD together, and generates the first reference demodulated signal C in which a harmonic component has been removed from the result of the multiplication. In the example in FIG. 6, the first reference demodulating unit 601 includes a multiplying unit 611 that multiplies the reference signal RD and first synchronization signal U1 together, and also includes a low-pass filter 612 that removes the harmonic component from the multiplication result in the multiplying unit 611.

The second reference demodulating unit 602 preferably multiplies the second synchronization signal U2 and reference signal RD together, and generates the second reference demodulated signal D in which a harmonic component has been removed from the result of the multiplication. In the example in FIG. 6, the second reference demodulating unit 602 includes a multiplying unit 621 that multiplies the reference signal RD and second synchronization signal U2 together, and also includes a low-pass filter 622 that removes the harmonic component from the multiplication result in the multiplying unit 621.

The phase change calculating unit 603 preferably calculates a change in the phase of the detection complex number Qs (=A+jB), in which the first demodulated signal A is a real part and the second demodulated signal B is an imaginary part, according to a change in the phase of the reference complex number Qr (=C+jD), in which the first reference demodulated signal C is a real part and the second reference demodulated signal D is an imaginary part. For example, the phase change calculating unit 603 calculates a change in the phase of the reference complex number Qr (=C+jD) and regards the calculated change as a change in the phase of the detection complex number Qs (=A+jB). In the above description, the letter j represents the imaginary unit.

At, for example, the start of a detection operation, the phase change calculating unit 603 preferably acquires an initial value Qr0 of the reference complex number Qr and preferably calculates a correction complex number Qc having a phase matching a change in the phase of the reference complex number Qr with respect to the phase of the initial value Qr0. Specifically, the phase change calculating unit 603 preferably calculates a first complex number Q1 that has the same phase as the initial value Qr0 and the absolute value of which is 1, and each time a new reference complex number Qr is generated, preferably calculates a second complex number Q2 that has the same phase as the generated reference complex number Qr and the absolute value of which is 1. Each time the phase change calculating unit 603 calculates a new second complex number Q2, the phase change calculating unit 603 preferably calculates, as the correction complex number Qc (Q1/Q2), a complex number obtained by dividing the first complex number Q1 by the second complex number Q2.

When the phase of the initial value Qr0 is α and the phase of the reference complex number Qr is β, the first complex number Q1 and second complex number Q2 are represented as in equations below.

$$Q1 = \cos(\alpha) + j \cdot \sin(\alpha) \quad (1)$$

$$Q2 = \cos(\beta) + j \cdot \sin(\beta) \quad (2)$$

When the real part of the initial value Qr0 is CA and its imaginary part is DA (that is, Qr0=CA+j·DA), the real part COS(α) and imaginary part SIN(α) in equation (1) are represented as in equations below.

$$COS(\alpha)=CA/\{\sqrt{(CA^2+DA^2)}\} \quad (3)$$

$$SIN(\alpha)=DA/\{\sqrt{(CA^2+DA^2)}\} \quad (4)$$

The real part COS(β) and imaginary part SIN(β) in equation (2) are represented as in equations below.

$$COS(\beta)=C/\{\sqrt{(C^2+D^2)}\} \quad (5)$$

$$SIN(\beta)=D/\{\sqrt{(C^2+D^2)}\} \quad (6)$$

When the real part of the correction complex number Qc (Q1/Q2) is assumed to be a first correction signal E and its imaginary part is assumed to be a second correction signal F (that is, Qc=E−j·F), the first correction signal E and second correction signal F are represented as in equations below.

$$E=COS(\alpha-\beta)=SIN(\alpha)SIN(\beta)+COS(\alpha)COS(\beta) \quad (7)$$

$$F=-SIN(\alpha-\beta)=-SIN(\alpha)COS(\beta)+COS(\alpha)SIN(\beta) \quad (8)$$

The phase correcting unit 604 preferably calculates, as a corrected demodulated signal Mc, a signal that matches at least one of the real part and imaginary part of a complex number obtained by correcting the phase of the detection complex number Qs so that the change (β−α), calculated in the phase change calculating unit 603, in the phase of the detection complex number Qs is canceled. Specifically, the phase correcting unit 604 preferably calculates, as the corrected demodulated signal Mc, a signal matching at least one of the real part and imaginary part of the product (Qs·Qc) of the detection complex number Qs and correction complex number Qc.

The product (Qs·Qc) of the detection complex number Qs and correction complex number Qc is a complex number in which the phase (α−β) of the correction complex number Qc is added to the phase β of the detection complex number Qs. When the phase of the correction complex number Qc is added like this, an amount (β−α) by which the phase β of the detection complex number Qs was changed from the phase α of the initial value can be canceled in the phase β of the current detection complex number Qs. Here, it will be assumed that only the real part of the product (Qs·Qc) of the detection complex number Qs and correction complex number Qc is calculated and the real part is the corrected demodulated signal Mc for the first demodulated signal A of the detection complex number Qs. Then, the corrected demodulated signal Mc is represented as in an equation below.

$$Mc=F\cdot B+E\cdot A=-SIN(\alpha-\beta)\cdot B+COS(\alpha-\beta)\cdot A \quad (9)$$

Figure 7:
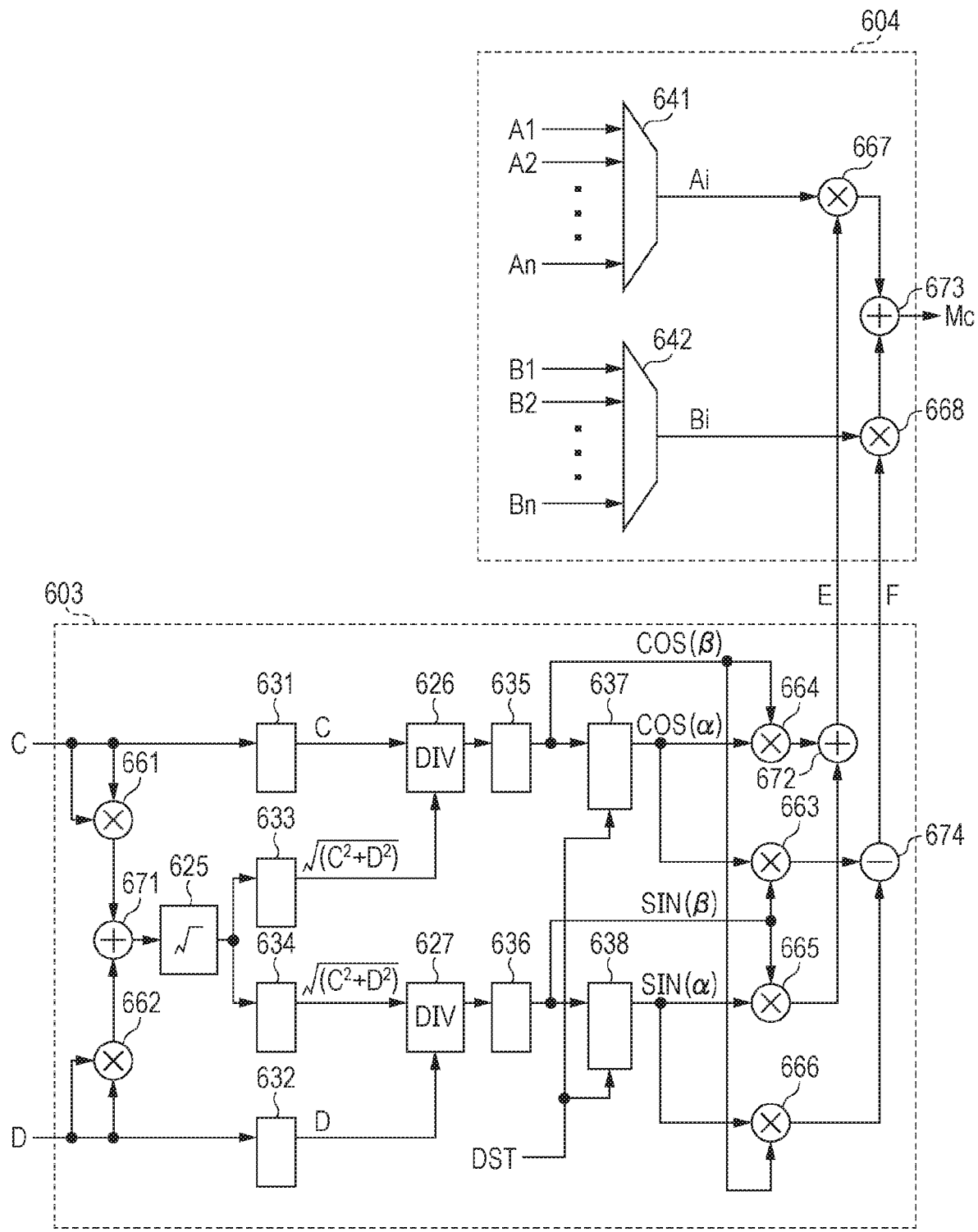
FIG. 7 illustrates an example of the structures of a phase change calculating unit and phase correcting unit.

FIG. 7 illustrates an example of the structures of the phase change calculating unit 603 and phase correcting unit 604. In the example in FIG. 7, the phase change calculating unit 603 has multiplying units 661 to 666, adding units 671 and 672, a subtracting unit 674, a square root calculating unit 625, dividing units 626 and 627, and registers 631 to 638. Also in the example in FIG. 7, the phase correcting unit 604 includes multiplying units 667 and 668, an adding unit 673, and multiplexers 641 and 642.

The first reference demodulated signal C is squared in the multiplying unit 661 and is also held in the register 631. The second reference demodulated signal D is squared in the multiplying unit 662 and is also held in the register 632. The first reference demodulated signal C squared in the multiplying unit 661 and the second reference demodulated signal D squared in the multiplying unit 662 are added together in the adding unit 671. The addition result is entered into the square root calculating unit 625, in which a square root is calculated. The calculated square root is held in the registers 633 and 634. In the dividing unit 626, the first reference demodulated signal C is divided by the held square root held in the register 633. COS(α) or COS(β), which is the division result, is held in the register 635. In the dividing unit 627, the second reference demodulated signal D is divided by the square root held in the register 634. SIN(α) or SIN(β), which is the division result, is held in the register 636.

When a control signal DST becomes active at a timing to acquire the initial value Qr0, the COS(α), which is the real part of the initial value Qr0 held in the register 635, is stored in the register 637. COS(α) is held in the register 637 until the next time the control signal becomes active. When the control signal DST becomes active at a timing to acquire the initial value Qr0, the SIN(α), which is the imaginary part of the initial value Qr0 held in the register 636, is stored in the register 638. SIN(α) is held in the register 638 until the next time the control signal becomes active.

The product of COS(β) held in the register 635 and COS(α) held in the register 637 is calculated in the multiplying unit 664. The product of SIN(β) held in the register 636 and SIN(α) held in the register 638 is calculated in the multiplying unit 665. The sum of these products is calculated in the adding unit 672. The addition result is output to the phase correcting unit 604 as the first correction signal E (see equation (7)). The product of COS(β) held in the register 635 and SIN(α) held in the register 638 is calculated in the multiplying unit 666. The product of SIN(β) held in the register 636 and COS(α) held in the register 637 is calculated in the multiplying unit 663. In the subtracting unit 674, the product in the multiplying unit 666 is subtracted from the product in the multiplying unit 663. The subtraction result is output to the phase correcting unit 604 as the second correction signal F (see equation (8)).

In the phase correcting unit 604, n first demodulated signals A1 to An are sequentially selected in the multiplexer 641 one at a time and are then entered into the multiplying unit 667, and n second demodulated signals B1 to Bn are sequentially selected in the multiplexer 642 one at a time and are then entered into the multiplying unit 668. The product of one selected first demodulated signal Ai and the first correction signal E is calculated in the multiplying unit 667. The product of one selected second demodulated signal Bi and the second correction signal F is calculated in the multiplying unit 668. These products are added together in the adding unit 673. The sum, calculated in the adding unit 673, of the products is sequentially output to the processing unit 80 as the corrected demodulated signal Mc (see equation (9)).

The processing unit 80 is a circuit that controls the entire operation of the sensor device. The processing unit 80 includes, for example, a central processing unit (CPU) that performs processing according to instruction code in a program and a special logic circuit configured to implement specific functions. All of processing in the processing unit 80 may be implemented by the CPU according to the program, or part or all of the processing may be implemented by the logic circuit.

The processing unit 80 sequentially accepts n corrected demodulated signals Mc, which have been demodulated in n demodulating units 50 and then corrected in the phase correcting unit 604, from the phase correcting unit 604, and processes the corrected demodulated signals Mc as detection results in n sensor units 20. For example, according to the detection results in n sensor units 20, the processing unit 80 calculates a position at which an object 1 such as a finger of the user has touched the electrode 202, determines the number of objects 1 that have touched and the state of the touch of the object 1, and performs other processing. The processing unit 80 communicates with, for example, a high-end host controller (not illustrated) to notify the host controller of information about detection results in the sensor unit 20 and perform other processing.

With the sensor device described above, when a variation (jitter) occurs in the phase of the clock signal CK, the phase of the detection signal S generated in the sensor unit 20 relatively varies with respect to the clock signal CK and the phase of the detection signal SD, which has been converted to a digital signal, also relatively varies with respect to the clock signal CK. Basically, however, the phases of the first synchronization signal U1 and second synchronization signal U2 synchronized with the clock signal CK do not relatively vary with respect to the clock signal CK. When the phase of the clock signal CK varies, therefore, the relative phase between the detection signal S and the first synchronization signal U1 and the relative phase between the detection signal S and the second synchronization signal U2 vary. Accordingly, the first demodulated signal A, in which a harmonic component has been removed from the result of multiplication of the detection signal S and first synchronization signal U1, and the second demodulated signal B, in which a harmonic component has been removed from the result of multiplication of the detection signal S and second synchronization signal U2, also vary.

With the sensor device described above, therefore, the modulated signals A and B are corrected according to the reference signal RD synchronized with the clock signal CK, the reference signal RD having been converted to a digital signal. First, since a correlation exists between the phase of the detection signal S with respect to the analog signal W and the phase of the reference signal R with respect to the analog signal W, changes in the relative phase of the reference signal RD with respect to the first synchronization signal U1 and second synchronization signal U2 are calculated. From the calculated changes in the phase, changes in the relative phase of the detection signal SD with respect to the first synchronization signal U1 and second synchronization signal U2 are inferred. For example, it is inferred that a calculated change in the phase of the reference signal RD is equal to a change in the phase of the detection signal SD.

As described above, the detection signal SD, which is a digital signal synchronized with the clock signal CK, is multiplied by each of the first synchronization signal U1 and second synchronization signal U2, each of which is a sine wave and which have the same detection frequency as the analog signal W and also have phases shifted from each other by one-fourth of a cycle, after which two demodulated signals are generated in which a harmonic component has been removed from the results of the multiplication. Since the first synchronization signal U1 and second synchronization signal U2 are orthogonal to each other, the first demodulated signal A represents the relative phase of the detection signal SD with respect to the first synchronization signal U1 and the second demodulated signal B represents the relative phase of the detection signal SD with respect to the second synchronization signal U2. Specifically, the phase of the detection complex number Qs, in which the first demodulated signal A is the real part and the second demodulated signal B is the imaginary part, represents the phase of the detection signal SD.

Then, the demodulated signals A and B are corrected so that the relative phase of the detection signal SD with respect to the first synchronization signal U1 represented by the first demodulated signal A and the second synchronization signal U2 represented by the second demodulated signal B approaches a phase that is canceled by an amount equal to the calculated change in the phase. Thus, even if the relative phase between the first synchronization signal U1 and the detection signal SD and the relative phase between the second synchronization signal U2 and the detection signal SD vary along with a variation in the phase of the clock signal CK, the demodulated signals A and B are corrected so that this phase variation is canceled. This makes it possible to effectively suppress variations in the demodulated signals A and B that are caused by a variation in the phase of the clock signal CK.

Second Embodiment

Next, a second embodiment of the present invention will be described.

Figure 8:
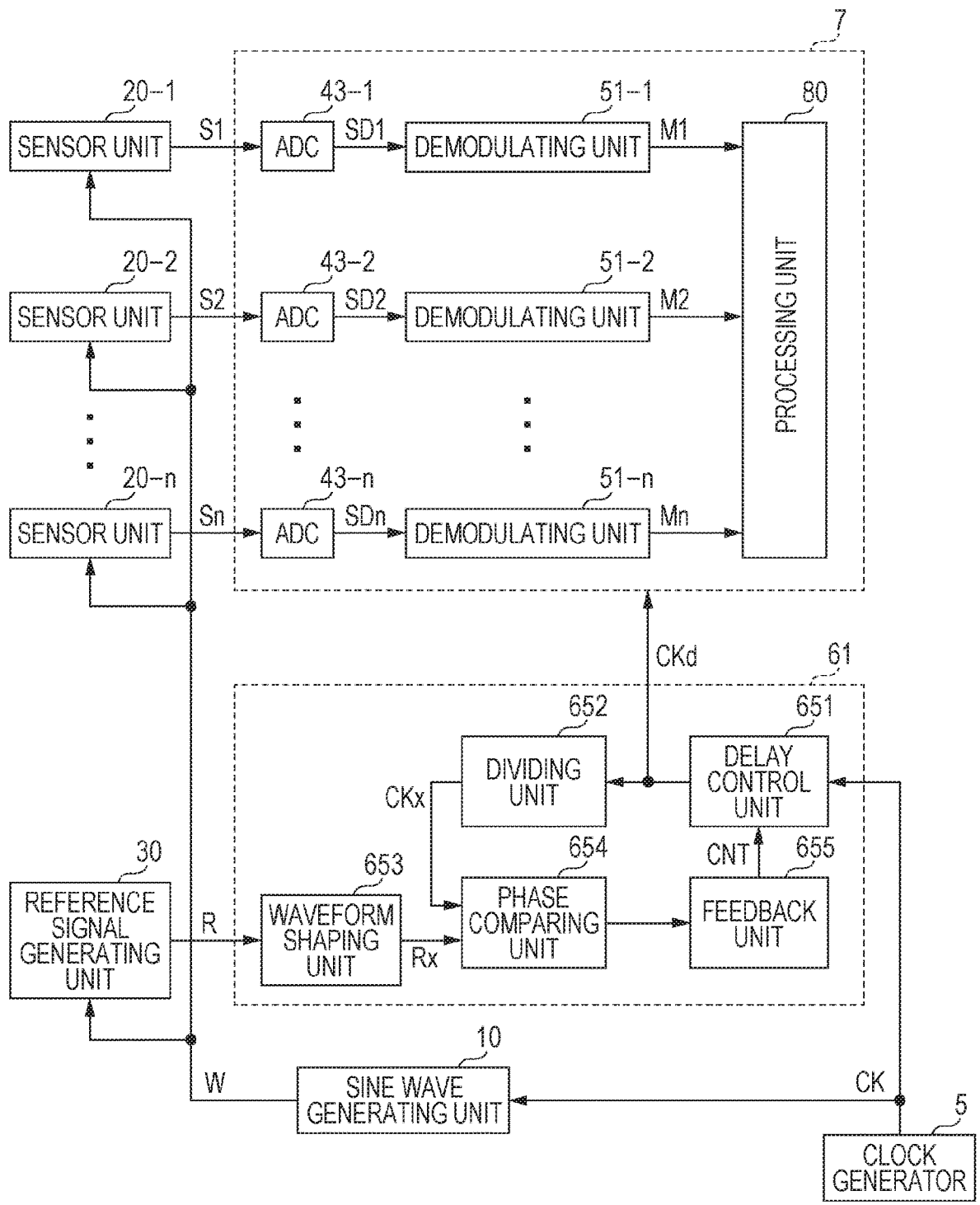
FIG. 8 illustrates an example of the structure of a sensor device according to a second embodiment.

FIG. 8 illustrates an example of the structure of a sensor device according to a second embodiment. The sensor device in FIG. 8 has a clock generator 5, a sine wave generating unit 10, n sensor units 20-1 to 20-n, a reference signal generating unit 30, n AD converting units 43-1 to 43-n (sometimes referred to below as the AD converting units 43 without being distinguished), n demodulating units 51-1 to 51-n (sometimes referred to below as the demodulating units 51 without being distinguished), a correcting unit 61, and a processing unit 80. Constituent elements that are substantially the same as in the sensor device, in FIG. 1, described above will be assigned identical reference numerals, and their detailed description will be omitted.

In the sensor device in FIG. 8, the n AD converting units 43, n demodulating units 51, and processing unit 80 are included in a digital circuit 7 that operates in synchronization with a correction clock signal CKd common to the constituent elements in the digital circuit 7. The phase of the correction clock signal CKd has been corrected by the correcting unit 61 with respect to the phase of the clock signal CK.

The AD converting unit 43 converts a detection signal Si received from the sensor unit 20-i to a digital signal in synchronization with the correction clock signal CKd, and outputs the digital signal as a detection signal SDi. The n AD converting units 43 each include an AD converting circuit, such as a delta-sigma AD converting circuit, in the same method, for example.

The demodulating unit 51-i multiplies the sinusoidal synchronization signal U and detection signal SDi together, the synchronization signal U having the same detection frequency as the analog signal W and being synchronized with the correction clock signal CKd, the detection signal SDi having been converted to a digital signal. The demodulating unit 51-i then generates a demodulated signal Mi (sometimes referred to below as the demodulated signal M without being distinguished) in which a harmonic component has been removed from the result of the multiplication.

Figure 9:
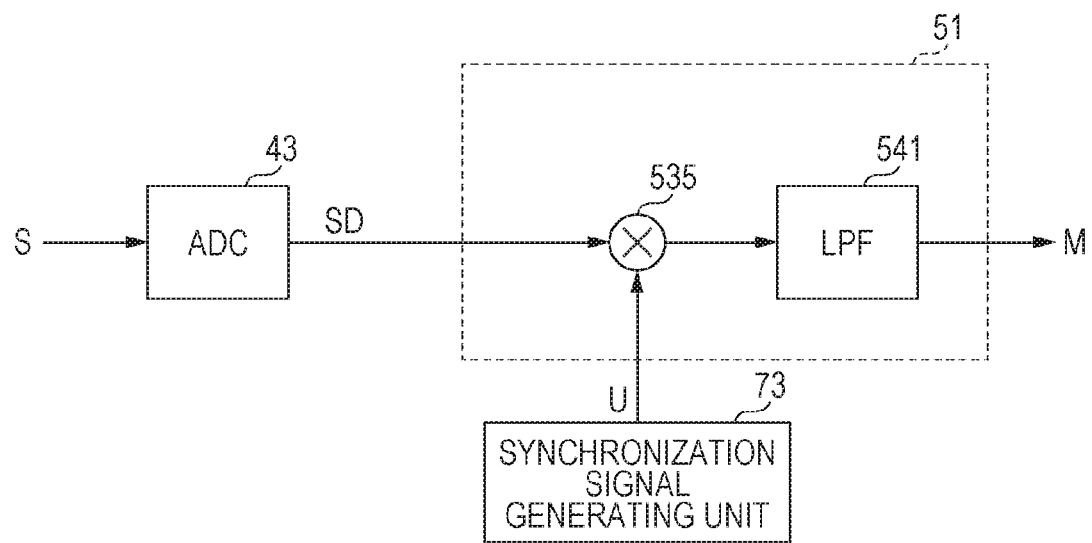
FIG. 9 illustrates an example of the structure of a demodulating unit.

The demodulating unit 51 includes, for example, a multiplying unit 535 that multiplies the synchronization signal U generated in a synchronization signal generating unit 73 and the detection signal SD together, and also includes a low-pass filter 541 that removes a harmonic component from the multiplication result in the multiplying unit 535, as illustrated in FIG. 9.

The digital circuit 7 includes the synchronization signal generating unit 73, illustrated in FIG. 9, that generates the synchronization signal U. The synchronization signal U is a sinusoidal digital signal (numerical data of a sine wave). The synchronization signal generating unit 73 generates the synchronization signal U at intervals of a predetermined period synchronized with the correction clock signal CKd.

The correcting unit 61 corrects the phase of the correction clock signal CKd with respect to the clock signal CK so that variations in the demodulated signal M that are caused by variations in the phase of the clock signal CK are suppressed. The correcting unit 61 detects a change in the relative phase of the reference signal R with respect to the correction clock signal CKd, and corrects the phase of the correction clock signal CKd with respect to the clock signal CK according to the result of the detection so that the relative phase of the reference signal R is kept constant.

As illustrated in FIG. 8, the correcting unit 61 preferably includes, for example: a delay control unit 651 that controls the delay of the correction clock signal CKd with respect to the clock signal CK according to an entered control signal CNT; a dividing unit 652 that divides the correction clock signal CKd and outputs the divided clock signal as a clock signal CKx; a waveform shaping unit 653 that shapes the waveform of the reference signal R into a pulse Rx in a rectangular waveform shape so that the phase of the reference signal R is detected; a phase comparing unit 654 that makes a comparison between the phase of the clock signal CKx and the phase of the pulse Rx generated from the reference signal R by being waveform-shaped; and a feedback unit 655 that feeds the control signal CNT back to the delay control unit 651 according to the phase comparison result in the phase comparing unit 654.

With the sensor device having the structure described above, a sinusoidal analog signal W synchronized with the clock signal CK is generated in the sine wave generating unit 10. In the sensor unit 20, a detection signal S is generated according to the analog signal W, the detection signal S having an amplitude matching a physical quantity to be detected and also having the same detection frequency as the analog signal W. In the reference signal generating unit 30, a reference signal R having the detection frequency is generated according to the analog signal W. A correlation exists between the phase of the detection signal S with respect to the analog signal W and the phase of the reference signal R with respect to the analog signal W. The detection signal S is converted to a digital signal synchronized with the correction clock signal CKd, the phase of which has been corrected with respect to the clock signal CK. The detection signal SD, which is a digital signal synchronized with the correction clock signal CKd, is multiplied by a sinusoidal synchronization signal having the detection frequency, after which a demodulated signal M is generated in which a harmonic component has been removed from the multiplication result.

When the phase of the clock signal CK varies, the phase of the analog signal W synchronized with the clock signal CK varies. Therefore, the phase of the detection signal S generated in the sensor unit 20 and the phase of the reference signal R generated in the reference signal generating unit 30 also vary. A variation in the phases of the detection signal S and reference signal R is caused by a variation in the phase of the analog signal W synchronized with the clock signal CK. Since the sine wave generating unit 10, sensor unit 20, and reference signal generating unit 30 each include an analog circuit, such as the low-pass filter 103, 211, or 311, that has a frequency response of the phase, a deviation occurs between a variation in the phases of the detection signal S and reference signal R output through the relevant analog circuit and a variation in the phase of the clock signal CK. That is, when the phase of the clock signal CK varies, the phases of the detection signal S and reference signal R relatively vary with respect to the clock signal CK.

Now, it will be assumed that the phase of the correction clock signal CKd with respect to the clock signal CK is fixed. Even when the phase of the clock signal CK varies, the phase of the sinusoidal synchronization signal U synchronized with the correction clock signal CKd does not relatively vary with respect to the clock signal CK. When the phase of the clock signal CK varies, however, the phase of the detection signal S relatively varies with respect to the clock signal CK and the phase of the detection signal SD, which has been converted to a digital signal, also relatively varies with respect to the clock signal CK. Therefore, when the phase of the clock signal CK varies, the relative phase between the detection signal SD and the synchronization signal U varies, and the demodulated signal M, in which a harmonic component has been removed from the result of a multiplication of the detection signal SD and synchronization signal U, varies.

With the sensor device described above, therefore, the phase of the correction clock signal CKd with respect to the clock signal CK is corrected. Specifically, in the correcting unit 61, a change in the relative phase of the reference signal R with respect to the correction clock signal CKd is detected, after which the phase of the correction clock signal CKd with respect to the clock signal CK is corrected according to the result of the detection so that the relative phase of the reference signal R with respect to the correction clock signal CKd is kept constant. A correlation exists between the phase of the detection signal S with respect to the analog signal W and the phase of the reference signal R with respect to the analog signal W. Therefore, when the relative phase of the reference signal R with respect to the correction clock signal CKd is kept constant, the relative phase of the detection signal S with respect to the correction clock signal CKd is also kept substantially constant. Thus, even when the phase of the clock signal CK varies, the relative phase between the detection signal SD and the synchronization signal U synchronized with the correction clock signal CKd is kept substantially constant. Since a variation in the relative phase between the synchronization signal U and the detection signal SD is suppressed, a variation in the demodulated signal M obtained from the result of a multiplication of the detection signal SD and synchronization signal U is also suppressed. Therefore, it possible to effectively suppress a variation in the demodulated signal M, the variation being caused by a variation in the phase of the clock signal CK.

The present invention is not limited to the embodiments described above. That is, a person having ordinary skill in the art may make various modifications, combinations, sub-combinations, and replacements for the constituent elements in the embodiments described above, without departing from the technical range of the present invention or an equivalent range of the technical range.

What is claimed is:

1. A sensor device comprising:
   a sensor unit that generates a detection signal according to an input analog signal which is a sinusoidal signal, the detection signal having an amplitude corresponding to a physical quantity associated with an object to be detected, the detection signal having a detection frequency which is the same as a frequency of the input analog signal, and a phase variation corresponding to a phase variation of the input analog signal;

a reference signal generating unit that generates a reference signal according to the input analog signal, the reference signal having the detection frequency, and a phase variation corresponding to the phase variation of the input analog signal;

a first analog-digital converting unit that converts the detection signal into a digitized detection signal in synchronization with a clock signal;

a second analog-digital converting unit that converts the reference signal to a digitized reference signal in synchronization with the clock signal;

a demodulating unit that generates and multiplies a complex synchronization signal with the digitized detection signal so as to generate a complex demodulated signal in synchronization with the clock signal, by removing harmonic components from a result of the multiplication, the complex synchronization signal being composed of a pair of synchronization signals which are a pair of digital sinusoidal signals having the detection frequency and phases shifted from each other by one-fourth of a cycle, a phase of the complex demodulated signal representing a relative phase of the detection signal with respect to the complex synchronization signal; and a correction unit that corrects the complex demodulated signal based on the digitized reference signal so as to suppress a phase variation in the complex demodulated signal caused by a phase variation in the clock signal, wherein the correcting unit is configured to:
calculate a change in the relative phase of the detection signal with respect to the complex synchronization signal based on a change in a relative phase of the reference signal with respect to the complex synchronization signal, and correct at least one of the pair of demodulated signals such that the relative phase of the detection signal with respect to the complex synchronization signal approaches such a phase that cancels the calculated change in the relative phase.

2. The sensor device according to claim 1, wherein:
the complex synchronization signal includes a first synchronization signal and a second synchronization signal;
the complex demodulated signal includes a first demodulated signal and a second demodulated signal;
the demodulating unit includes:
a first demodulating unit that multiplies the first synchronization signal and the detection signal, so as to generate the first demodulated signal in which harmonic components have been removed from a result of the multiplication; and
a second demodulating unit that multiplies the second synchronization signal and the detection signal, so as to generate the second demodulated signal by removing harmonic components from a result of the multiplication; and
the correction unit includes:
a first reference demodulating unit that multiplies the first synchronization signal and the reference signal, so as to generate a first reference demodulated signal by removing harmonic components from a result of the multiplication;
a second reference demodulating unit that multiplies the second synchronization signal and the reference signal, so as to generate a second reference demodulated signal by removing harmonic components from a result of the multiplication;

a phase change calculating unit that calculates a first phase change in a detection complex number having the first demodulated signal as a real part thereof and the second demodulated signal as an imaginary part thereof, based on a second phase change in a reference complex number having the first reference demodulated signal as a real part thereof and the second reference demodulated signal as an imaginary part thereof; and a phase correcting unit that generates a corrected demodulated signal by calculating a signal corresponding to at least one of the real part and the imaginary part of a corrected complex number obtained by correcting the detection complex number so that the first phase change is canceled.

3. The sensor device according to claim 2, wherein:
the phase change calculating unit calculates a phase correction complex number having a phase corresponding to a change in the phase of the reference complex number with respect to an initial phase of the reference complex number; and
the phase correcting unit calculates a product of the detection complex number and the phase correction complex number as the corrected complex number.

4. The sensor device according to claim 3, wherein the phase change calculating unit generates a first unit complex number having an absolute value of one (1) and an initial phase which is the same as the initial phase of the reference complex number, generates, each time a new reference complex number is generated, a second unit complex number having an absolute value of one (1) and a phase which is the same as the newly generated reference complex number, and calculate, each time the second complex number is generated, calculates the phase correction complex number by dividing the first unit complex number by the second unit complex number.

5. The sensor device according to claim 1, wherein the sensor unit includes:
an electrode forming a detection capacitor, the capacitance of which varies as the object approaches the detection capacitor; and
a capacitance detection circuit that applies a sinusoidal voltage corresponding to the input analog signal to the electrode, thereby generating the detection signal which includes a component corresponding to a current flowing in the detection capacitor according to the sinusoidal voltage.

6. The sensor device according to claim 5, wherein the reference signal generating unit has a same structure as that of the sensor unit except the reference signal generating unit has a built-in capacitor having a predetermined capacitance instead of the detection capacitor, whereby the reference signal is generated in the capacitance detection circuit instead of the detection signal.

7. A sensor device comprising:
a sine-wave generating unit that generates a sinusoidal analog signal synchronized with a clock signal;
a sensor unit that generates a detection signal according to the analog signal, the detection signal having an amplitude corresponding to a physical quantity associated with an object to be detected, the detection signal having a detection frequency which is the same as a frequency of the analog signal, and a phase variation corresponding to a phase variation in to the analog signal;

a reference signal generating unit that generates a reference signal according to the analog signal, the reference signal having the detection frequency, and a phase variation corresponding to the phase variation of the analog signal;

an analog-digital converting unit that converts the detection signal into a digitized detection signal in synchronization with a correction clock signal, the correction clock signal having a phase which has been corrected with respect to the clock signal;

a demodulating unit that generates and multiplies a synchronization signal with the digitized detection signal in synchronization with the correction clock signal, so as to generate a demodulated signal by removing harmonic components from a result of the multiplication, the synchronization signal being a digital sinusoidal signal having the detection frequency; and a correction unit that corrects a phase of the correction clock signal with respect to the clock signal so as to suppress a phase variation in the demodulated signal caused by a phase variation in the clock signal, wherein the correcting unit is configured to:

detect a change in a relative phase of the reference signal with respect to the correction clock signal, and corrects the phase of the correction clock signal with respect to the clock signal such that the relative phase of the reference signal with respect to the correction clock signal is kept constant in accordance with the detected change in the relative phase.

8. The sensor device according to claim 7, wherein the correction unit includes:

a delay control unit that controls a delay of the correction clock signal with respect to the clock signal according to a control signal input thereto;

a phase comparing unit that makes a comparison between a phase of the reference signal and the phase of the correction clock signal, or the phase of the reference signal and a phase of a signal obtained by dividing the correction clock signal; and a feedback unit that feeds the control signal back to the delay control unit according to a comparison result in the phase comparing unit.

* * * * *